United States Patent [19]

Conti

[11] 4,321,611
[45] Mar. 23, 1982

[54] AVALANCHE PHOTODETECTOR FOR FIBER-OPTICAL SYSTEM AND METHOD OF MAKING SAME

[75] Inventor: Mario Conti, Milan, Italy

[73] Assignee: CSELT Centro Studi e Laboratori Telecomunicazioni S.p.A., Turin, Italy

[21] Appl. No.: 24,076

[22] Filed: Mar. 26, 1979

[30] Foreign Application Priority Data

Apr. 4, 1978 [IT] Italy .................... 67838 A/78

[51] Int. Cl.³ ............................................ H01L 29/90
[52] U.S. Cl. ........................................ 357/13; 357/30; 357/55
[58] Field of Search ............................ 357/13, 30, 55

[56] References Cited

U.S. PATENT DOCUMENTS

| 4,083,062 | 4/1978 | Ohuchi | 357/13 |
| 4,127,932 | 12/1978 | Hartman | 357/13 X |
| 4,129,878 | 12/1978 | Webb | 357/13 |
| 4,133,698 | 1/1979 | Chiang | 357/30 X |
| 4,135,950 | 4/1977 | Rittner | 357/55 X |

OTHER PUBLICATIONS

Somekh, *J. Vac. Sci. Technol.*, vol. 13, No. 5, Sep./Oct. 1976, pp. 1003–1007.

*Primary Examiner*—Martin H. Edlow
*Attorney, Agent, or Firm*—Karl F. Ross

[57] ABSTRACT

A detector for luminous radiation transmitted by an optical fiber comprises an avalanche photodiode whose light-receiving surface, separated by a high-resistivity portion of a semiconductor body from a reverse-biased p/n junction, is serrated with major sawtooth flanks substantially parallel and minor sawtooth flanks substantially perpendicular to the direction of incident radiation. The optical fiber emitting that radiation is laterally offset from the semiconductor body and has an axis including a small angle with the plane of the p/n junction.

7 Claims, 2 Drawing Figures

AVALANCHE PHOTODETECTOR FOR FIBER-OPTICAL SYSTEM AND METHOD OF MAKING SAME

FIELD OF THE INVENTION

My present invention relates to an avalanche photodiode to be used as a detector for luminous radiation in a fiber-optical signaling system.

BACKGROUND OF THE INVENTION

The sensitivity of a photodetector can be defined as the ratio between the generated current flow and the luminous energy stimulating the photodetector into conduction. A high degree of sensitivity is, of course, desirable in fiber-optical transmission systems in which the luminous signals have to travel considerable distances from a transmitting to a receiving station.

Optical fibers are known to have good transmission characteristics in a wavelength range of 0.7 to $0.9\mu$ as well as in a so-called "second window", ranging from 1.06 to $1.2\mu$, in which their attenuation is relatively low. In this latter range, however, conventional avalanche photodiodes are not very efficient by reason of the limited absorption depth, i.e. the thickness of a high-resistivity portion of their semiconductor bodies which charge carriers in the form of electron/hole pairs are generated by the incident radiation. The absorption depth or thickness of this high-resistivity portion, bounded at one major body surface by two highly doped layers forming a reverse biased p/n junction and on the opposite major body surface by another layer of reduced resistivity, usually lies between about 20 and $120\mu$. With frontal illumination, i.e. with the light rays impinging substantially orthogonally upon the major body surface remote from the p/n junction, the path of the charge carriers generated with this lower-frequency radiation is insufficient for effective detection by avalanche action. A significant increase of the thickness of the highly resistive body portion beyond the above-indicated limit, on the other hand, is impractical since it would introduce undue delays into the response of the photodetector.

In an article by S. E. Miller et al in Proceedings of the IEEE, Vol. 61, No. 12, December 1973, entitled "Research Toward Fiber-Optical Transmission Systems", avalanche photodiodes have been described (pages 1738, 1739) which are illuminated from the side to increase the effective absorption depth of the semiconductor body. Because of the limited thickness of this body, however, the radiation can be received only by a narrow area with a maximum width on the order of $100\mu$; thus, the output end of the fiber illuminating that body must be precisely centered with reference to the receiving area. The incident radiation, moreover, is rapidly absorbed as it penetrates the active zone of the body confronting the juxtaposed layers of opposite conductivity type, a significant part of the radiant energy being lost in a region near the entrance edge of the body lying outside this active zone.

OBJECTS OF THE INVENTION

A principal object of my present invention, therefore, is to provide an improved photodetector of high sensitivity for use as a radiation receiver in a fiber-optical signaling system.

A related object is to provide a method of producing such a photodetector.

SUMMARY OF THE INVENTION

An avalanche photodetector embodying my invention has a generally plate-shaped body of semiconductor material with a basically conventional structure, namely a high-resistivity intermediate portion, a highly doped first layer of one conductivity type adjoining that portion while being overlain by a highly doped second layer of the opposite conductivity type forming therewith a p/n junction on one major body surface, a third layer of the same conductivity as the first layer on the other major body surface, and a pair of electrodes which are respectively in contact with the second and third layer for applying a reverse-biasing potential to the p/n junction across the semiconductor body. More particularly, the intermediate body portion may be lightly doped with p-type impurities to have a $\pi$ conductivity type, with a resistivity approaching that of the intrinsic semiconductor material, while the first, second and third layers are of p+, n+ and p conductivity, respectively. A front-illuminated avalanche photodiode of this structure ($p+/\pi/p/n+$) has been described on page 1739 of the above-identified article by Miller et al.

In accordance with my present improvement, the major body surface remote from the p/n junction—i.e. the one which is provided with the third layer—is of serrated shape with major sawtooth flanks generally parallel and minor sawtooth flanks generally perpendicular to the first and second layers. Upon illumination by an optical fiber whose output end is disposed close to that serrated surface but laterally offset from the body, with the fiber axis trained substantially perpendicularly upon a minor sawtooth flank near the center of the body, a multiplicity of such minor sawtooth flanks are illuminated by the incident radiation whose rays pass substantially parallel to the major flanks. The light, therefore, falls upon staggered surface areas which are distributed over practically the entire disk face and whose combined height may substantially exceed the thickness of the intermediate body portion.

Pursuant to another aspect of my invention, the avalanche photodiode of my improved photodetector is manufactured by converting a portion of the generally disk-shaped body of $\pi$ conductivity into the aforementioned first layer by diffusing an acceptor material into same, producing the second layer on the first layer by diffusing a donor material into the body at the same surface, etching the opposite major body surface by ion bombardment to form the aforedescribed serrated face, and thereafter doping the body on its serrated surface with acceptor material to form the third layer; an exposed area of the second layer and a marginal part of the third layer are then metallized to form the electrodes for the application of the reverse-biasing potential to the p/n junction.

SPECIFIC DESCRIPTION

Figure 1:
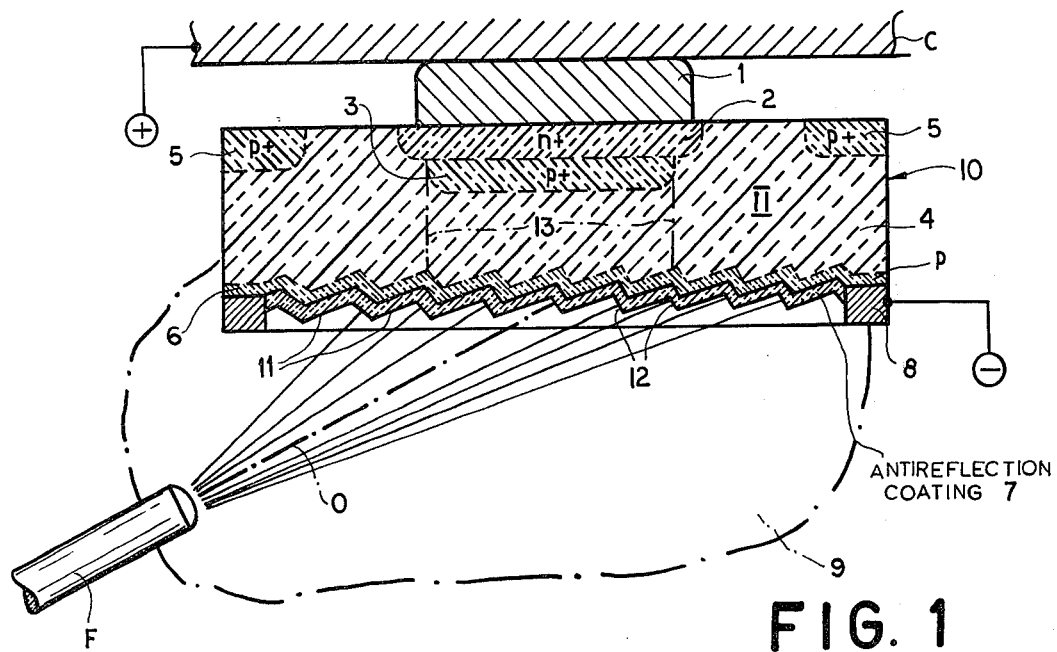
FIG. 1 is a somewhat diagrammatic sectional view of a high-sensitivity photodetector according to my invention, juxtaposed with the output end of an optical fiber.
Figure 2:
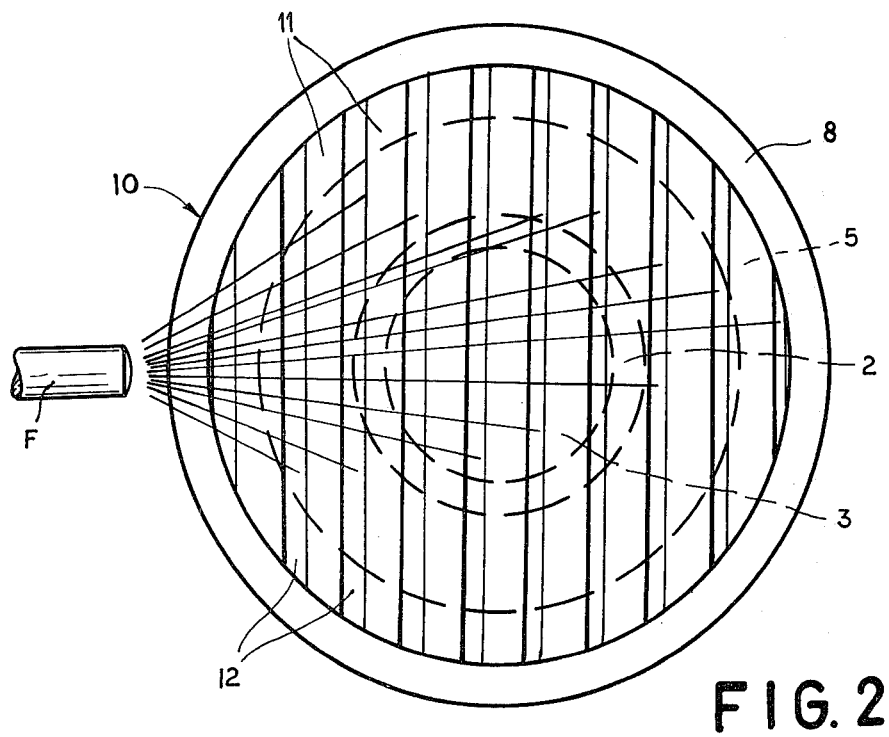
FIG. 2 is a bottom view of the assembly of FIG. 1.

In the drawing I have shown at C a part of the metallic housing for a photodiode comprising a semiconductor body 10, e.g. of silicon, the housing being connected to the positive terminal of a nonillustrated source of direct current so as to serve as a cathode lead for my improved photodetector. Body 10 is generally disk-shaped (though its outline need not be circular as shown) with one major surface confronting the housing C and another major surface illuminated by the output end of an optical fiber F.

A metallic electrode 1, preferably a layer of gold, overlies a layer 2 of n+ conductivity formed in the upper surface of body 10, this layer adjoining a layer 3 of p+ conductivity. A similar layer 6 of the same conductivity type (p) but preferably lower concentration of impurities extends along the lower body surface which is separated from layers 2 and 3 by a lightly doped intermediate portion 4 of $\pi$ conductivity. The periphery of layer 6 is in contact with a metallic layer 8, preferably also of gold, which serves as an anode lead and is connected to the negative terminal of the source.

A guard ring 5 of the same p+ conductivity spacedly surrounds the two juxtaposed layers 2, 3 along the periphery of the upper disk surface to prevent, in a manner known per se, the flow of leakage currents between electrodes 1 and 8 on the surface of body 10. Such leakage currents may come into existence by the accumulation of environmental impurities on the exposed body surface, which could act as electron donors converting an outer zone of the body from $\pi$ to n conductivity. The ring 5, enriched with acceptor impurities, effectively interrupts the leakage path so created.

In accordance with my present invention, the lower surface of body 10 is serrated to form major sawtooth flanks 11 and minor sawtooth flanks 12, the former being generally parallel and the latter being generally perpendicular to the upper body surface and thus to layers 2 and 3. The output end of fiber F is so positioned that its axis 0 is in line with one of the minor sawtooth flanks 12, more or less at the center of body 4, and is substantially perpendicular to that flank, as shown; thus, the rays exiting from fiber F are approximately parallel to the major flanks and perpendicular to the minor flanks of the sawtooth pattern. The combined height of the minor sawtooth flanks 12 is considerably greater than the thickness of body portion 4 measured between layers 3 and 6. Moreover, practically the entire radiation reaches the layer 6 at or near the active body zone whose imaginary boundary 13 extends along the periphery of layer 3.

Axis O is shown to include an acute angle, of less than 30°, with the major surfaces of body 10.

The minor sawtooth flanks 12 of the serrated profile need not be all parallel to one another but may have different inclinations according to the direction of incidence of the illuminating rays. The spread of these rays may be limited, as known in the art, by providing the output end of the fiber F with a convex surface (as shown) or by interposing a lens in the ray path.

In FIG. 1 I have further illustrated the bottom layer 6 as provided with an antireflection coating as shown per se, e.g. of $SiO_2$ or $Si_3N_4$, substantially matching the refractive index of fiber F. In addition, or in lieu thereof, the entire fiber end and at least part of body 10 including its serrated lower face may be enveloped by a transparent mass having such a refractive index, as diagrammatically indicated at 9. Such a mass could be, for example, a cement designed to immobilize the fiber with reference to the photodetector.

As will be readily apparent, the electron/hole pairs generated within body portion 4 by the incident radiation split up into electrons moving toward the cathode 1 and holes moving toward the anode 8. The electric field is substantially constant throughout body portion 4 but rises sharply at the junction between layers 2 and 3 whereby the electrons are greatly accelerated and break the covalent bonds of the ions of the crystalline lattice with which they collide, thus giving rise to the avalanche effect which results in the multiplication of the available charge carriers.

In producing the photodiode 10, I start with a body 10 of $\pi$ conductivity in which the p+ layer 3 is formed by diffusing acceptor material in the form of compounds of a trivalent element, such as boron, into the upper body surface as is well known in the art. The guard ring 5 may be formed at the same time by a like diffusion, with masking of surface portions which are not to be doped. Next, compounds of a pentavalent element such as phosphorus are diffused as a donor material into part of the region previously doped with acceptor material so as to form the n+ layer 2. The serration of the opposite disk surface can be carried out by ion or plasma etching and suitable masking, such a technique having been described in an article by S. Samekh, entitled "Introduction to Ion and Plasma Etching", Journal of Vacuum Science and Technology", Vol. 13, 1976, page 1003. The serrated surface is then moderately doped with acceptor material to form the p layer 6, this step being followed by metallization to produce the electrodes 1 and 8.

I claim:

1. A high-sensitivity avalanche photodetector comprising a generally plate-shaped body of semiconductor material with a high-resistivity intermediate portion, a highly doped first layer of one conductivity type adjoining said intermediate portion while being overlain by a highly doped second layer of the opposite conductivity type forming therewith a p/n junction on one major surface of said body, a third layer of said one conductivity type adjoining said intermediate portion on the other major surface of said body, and a pair of electrodes respectively in contact with said second and third layers for applying a reverse-biasing potential to said p/n junction across said body;

said other major surface provided with said third layer being serrated with major sawtooth flanks generally parallel and minor sawtooth flanks generally perpendicular to said first and second layers.

2. A photodetector as defined in claim 1 wherein said intermediate portion is of $\pi$ conductivity, said first layer is of p+ conductivity, said second layer is of n+ conductivity and said third layer is of p conductivity.

3. A photodetector as defined in claim 1 or 2 wherein said third layer is overlain by an antireflection coating.

4. A photodetector as defined in claim 1 or 2 wherein said body further includes a guard ring of the same conductivity type as said first layer surrounding said second layer on said one major surface.

5. In combination, a photodetector as defined in claim 1 or 2 and an optical fiber having an output end disposed close to said serrated major surface but laterally offset from said body, said output end having an axis trained substantially perpendicularly upon a minor sawtooth flank near the center of said body for irradiating a multiplicity of said minor sawtooth flanks.

6. The combination defined in claim 5 wherein the combined height of the minor sawtooth flanks irradiated by said fiber substantially exceeds the thickness of said intermediate portion.

7. The combination defined in claim 5, further comprising a transparent mass of a refractive index substantially matching that of said fiber, said mass enveloping said output end and at least part of said body including said serrated major surface.

* * * * *